United States Patent [19]

Cagliostro et al.

[11] Patent Number: 4,824,711
[45] Date of Patent: Apr. 25, 1989

[54] CERAMIC HONEYCOMB STRUCTURES AND METHOD THEREOF

[75] Inventors: Domenick E. Cagliostro, Berkeley; Salvatore R. Riccitiello, San Jose, both of Calif.

[73] Assignee: The United States of America as represented by the United States National Aeronautics and Space Administration, Washington, D.C.

[21] Appl. No.: 8,242

[22] Filed: Jan. 29, 1987

[51] Int. Cl.$^4$ .............................................. B32B 3/12
[52] U.S. Cl. ..................................... 428/116; 156/89; 427/255; 428/245; 428/698
[58] Field of Search ............... 428/116, 118, 245, 698; 156/89; 427/255

[56] References Cited

U.S. PATENT DOCUMENTS

| | | | |
|---|---|---|---|
| 2,303,658 | 12/1942 | Porter | 427/255 |
| 3,900,646 | 8/1975 | Clyde | 427/55 |
| 4,014,147 | 3/1977 | Wesch | 428/116 X |
| 4,077,215 | 3/1978 | Reams et al. | 60/517 |
| 4,476,178 | 10/1984 | Veltri et al. | 428/215 |
| 4,488,920 | 12/1984 | Danis | 428/698 X |
| 4,515,860 | 5/1985 | Holzl | 428/366 X |
| 4,574,459 | 3/1986 | Peters | 29/558 X |
| 4,585,618 | 4/1986 | Fresnel et al. | 204/242 X |

*Primary Examiner*—Henry F. Epstein
*Attorney, Agent, or Firm*—Darrell G. Brekke; John R. Manning; Charles E. B. Glenn

[57] ABSTRACT

The present invention relates to a method for producing ceramic articles and the articles, the process comprising the chemical vapor deposition (CVD) and/or chemical vapor infiltration (CVI) of a honeycomb structure.

Specifically the present invention relates to a method for the production of a ceramic honeycomb structure, including:

(a) obtaining a loosely woven fabric/binder wherein the fabric consists essentially of metallic, ceramic or organic fiber and the binder consists essentially of an organic or inorganic material wherein the fabric/binder has and retains a honeycomb shape, with the proviso that when the fabric is metallic or ceramic the binder is organic only;

(b) substantially evenly depositing at least one layer of a ceramic on the fabric/binder of step (a); and (c) recovering the ceramic coated fiber honeycomb structure.

In another aspect, the present invention relates to a method for the manufacture of a lightweight ceramic-ceramic composite honeycomb structure, which process comprises:

(d) pyrolyzing a loosely woven fabric a honeycomb shaped and having a high char yield and geometric integrity after pyrolysis at between about 700° and 1,100° C.;

(e) substantially evenly depositing at least one layer of ceramic material on the pyrolyzed fabric of step (a); and (f) recovering the coated ceramic honeycomb structure. The ceramic articles produced have enhanced physical properties and are useful in aircraft and aerospace uses.

24 Claims, 2 Drawing Sheets

CERAMIC HONEYCOMB STRUCTURES AND METHOD THEREOF

Origin of the Invention

The invention described herein was made by employees of the United States Government and may be manufactured and used by or for the government for governmental purposes without payment of any royalties thereon or therefor.

BACKGROUND OF THE INVENTION

1. FIELD OF THE INVENTION

The present invention relates to a method of producing an improved composite-composite structure for aircraft or aerospace use. The method and articles produced thereby generally involve pyrolyzing a loosely woven organic or inorganic fiber/binder in the shape of a honeycomb, depositing a ceramic material onto the carbonized fabric, optionally removing the pyrolyzed organic fabric and depositing the same or a different ceramic material onto and within the hollow honeycomb structure.

2. DESCRIPTION OF THE PRIOR ART

In the present art, polymeric, metallic and ceramic structures have been produced at low temperatures or in situations wherein weight requirements are not of concern. Structures having intricate designs, such as honeycomb structures, have not been described.

In U.S. Pat. No. 4,488,920, L. J. Danis discloses a process of making a large scale ceramic heat exchanger by separately forming grooved components and bonding these components together by chemical vapor deposition.

In U.S. Pat. No. 4,515,860, R. A. Holzl discloses a method for coating carbon bodies to protect them at elevated temperatures.

In U.S. Pat. No. 4,476,178, R. D. Veltri et al., disclose a multilayered coating system for the protection of carbon-carbon composites. Silicon carbide is diffused onto a carbon substrate which successfully protects the carbon-carbon material from oxidation at temperatures up to 2,500° F. and higher. These references individually or collectively do not disclose the present invention.

One approach to produce ceramic honeycomb structures is to extrude ceramic forms having the following shapes:

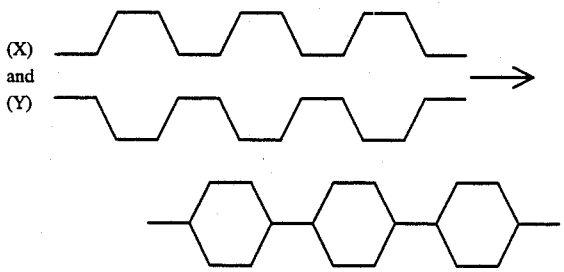

The two shapes are layered one on top of the other so that the flat portions are mated and a regular honeycomb structure is obtained. These points of juncture are then either adhered to each other using ceramic adhesive or are fused together using deposition or simply using elevated temperature. The honeycomb has hexagonal solid sides and hexaon-shaped openings therebetween. This method is long, involved, requires extensive hand labor and is expensive.

Previous attempts to produce ceramic-ceramic honeycomb structures by deposition have used porous substrates with uneven pore size distributions. These configurations have caused slow deposition rates and also pore blockage reducing penetration of the ceramic into the substrate. It is therefore desirable to develop a method to produce ceramic honeycomb based materials which have increased structure stability, improved physical properties, lighter weight properties, better high temperature limits (e.g., between about 700° to 1,800° C.) and the like.

It is an object of the present invention to provide a process and articles thereof wherein an organic, inorganic or metallic fabric made rigid in an organic binder or an organic fabric and an inorganic binder is used as a honeycomb form for the chemical vapor deposition/chemical vapor infiltration/deposition of a ceramic material to produce the corresponding ceramic honeycomb.

It is an object of the present invention to provide a process to obtain a ceramic coated pyrolyzed organic polymer/fabric honeycomb structure.

It is another object of the present invention to provide a process to obtain a ceramic honeycomb wherein the carbon-based fabric/binder honeycomb internal structure has been removed.

It is still another object of the present invention to provide a process to obtain a ceramic object which is formed by first depositing ceramic in all of the holes of the honeycomb fabric and or binder structure left by pyrolyzing and removing the organic components.

It is still another object to provide a process to obtain a ceramic object formed when the ceramic is deposited upon the degradable honeycomb structure, the honeycomb structure is removed and the voids created by removal are filled with more ceramic material.

SUMMARY OF THE INVENTION

The present invention relates to a method for the manufacture of a ceramic honeycomb structure, which process comprises:

(a) obtaining a loosely woven fabric in a binder wherein the fabric consists essentially of metallic, ceramic or organic fibers and the binder consists essentially of an organic or inorganic material, with the proviso that when the fibers are ceramic or metallic the binder is not an inorganic material, wherein the fabric/binder has an retains a substantially honeycomb shape;

(b) substantially evenly depositing at least one layer of a ceramic on the fabric binder of step (a); and (c) recovering the ceramic coated honeycomb structure.

In another aspect, the present invention relates to a method for the manufacture of a light weight ceramic-ceramic composite honeycomb structure, which process comprises:

(a) pyrolyzing a loosely woven fabric having a honeycomb shape and exhibiting a high char yield and geometric integrity after pyrolysis at between about 700° and 1,100° C.;

(b) substantially evenly depositing at least one layer of a ceramic material on the pyrolyzed fabric of step (a); and (c) recovering the coated ceramic honeycomb structure.

In another aspect, the present invention discloses after step (c):

a step (d) wherein the pyrolyzed fabric of the structure of step (c) is slowly removed by pyrolysis/oxidation at between 500° and 1000° C., e.g. by using between about a 2 to 5% by volume oxygen atmosphere.

The present invention also comprises, in accordance with the objects and purposes described herein, the articles of manufacture comprising the degradable honeycomb form and the ceramic material, the ceramic article when the honeycomb form has been removed, and the ceramic article where the volume of the ceramic article which originally contained the degradable honeycomb form are filled with a ceramic material.

DETAILED DESCRIPTION OF THE INVENTION AND PREFERRED EMBODIMENTS

As used herein:

"Ceramic-ceramic" describes a structure wherein one ceramic is deposited in any manner upon a second ceramic material. Additional layers of ceramic (the same or different) may also be subsequently deposited.

"Metallic" refers to a metallic fabric having useful high temperature properties. Typical metallic fabrics include titanium, nickel, or stainless steel.

"Organic" fibers or fabric includes, for example, aramids, Nomex®️ (polyamide), Kevlar®️, carbon, and the like. The organic fibers or fabric have properties that they maintain their shape at temperatures of between about ambient temperature and 1,300° C., and when heated in an oxygen free atmosphere do not sag or deform appreciably and produce a high char yield. Typical carbon fibers are disclosed in "High Performance Composites" by J. Davis in *Kirk-Othmer: Encyclopedia of Chemical Technology*, 3rd Edition, Supplement Volume, N.Y., John Wiley and Sons, published in 1984 and U.S. Pat. No. 4,526,925 (PSP), both of which are incorporated herein by reference.

"Inorganic" fibers or fabrics refers, for example, to fiberglass, alumina borosilicate, silica, silicon carbide, silicon nitride, silicon boride, boron nitride, boron carbide and the like. Alumina borosilicate fabrics are available from Hexcel Corporation of Dublin, California.

"Organic" binder refers, for example, to resins to maintain the structural integrity of the honeycomb shape. Organic binder refers, for example, to phenol resins, epoxy resins, polyimide resins, polyphenylene sulfide, polybenzimidazole, polystyrylpyridine (PSP), and the like.

"Inorganic" binder, refers to inorganic materials which are useful to retain the structural integrity of the honeycomb shape. Inorganic binde refers to, for example, silica, titania, alumina, zirconia, and the like.

Chemical vapor infiltration/chemical vapor deposition processes (CVI/CVD) for ceramics are known and described in, for instance: A. J. Caputo, et al. *Ceramic Engineeering and Science Proceedings*, Vol. 5, July/ Aug. 1984, pp. 654–667. D. P. Stinton, et al., "Synthesis of Fiber-Reinforced SiC Composites by Chemical Vapor Infiltration, " Preprint-American Ceramic Society Bulletin, Feb. 1986, and D. P. Stinton et al., "Simultaneous Chemical Vapor Deposition of SiC-Dispersed Phase Composites", Proceedings of the Ninth Annual Conference on Composites and Advanced Ceramic Materials, Cocoa Beach, Fla., Jan. 20–23, 1980, all of which are incorporated herein by reference.

Figure 1:
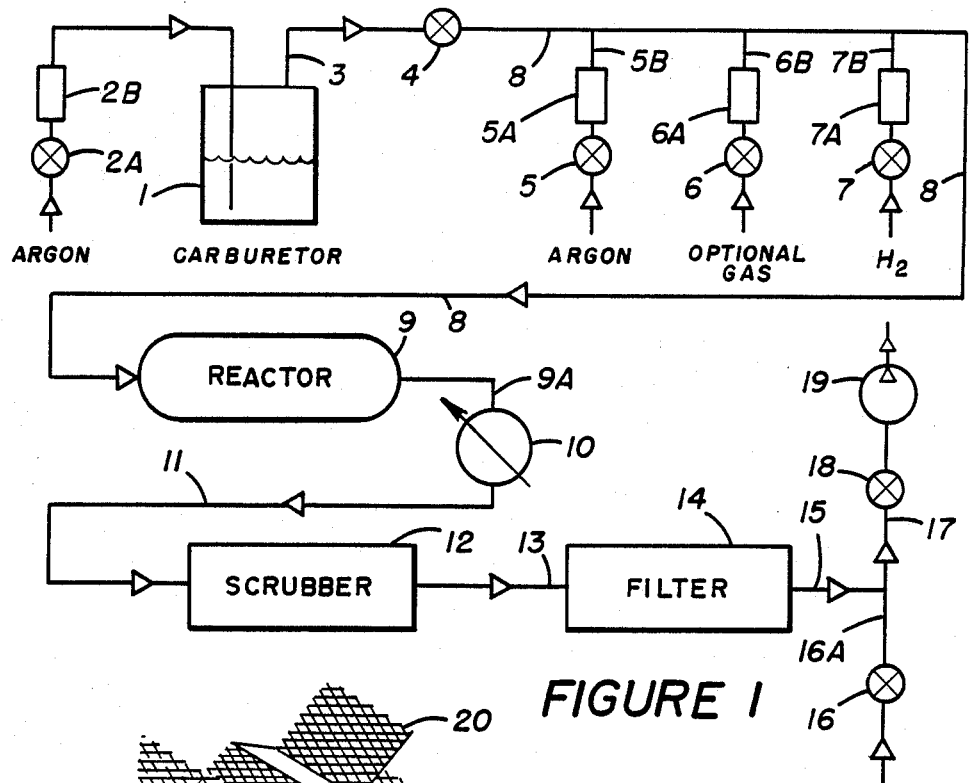
FIG. 1 is a schematic of the chemical vapor deposition/chemical vapor infiltration used to prepare the ceramic honeycomb.
Figure 2:
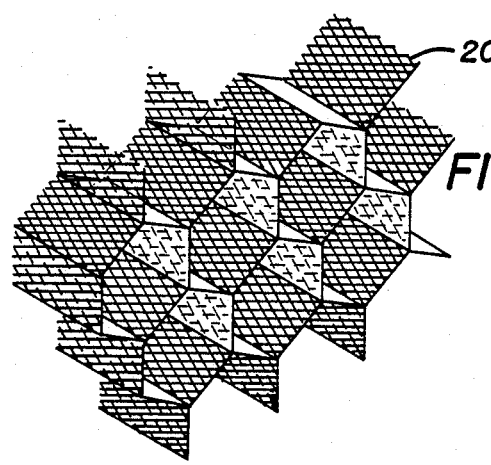
FIG. 2 is an isometric view of the loosely-woven fabric in a honeycomb shape.

Referring then to FIGS. 1–8, the broadest embodiment of the present invention may be described by starting with a loosely woven fabric 20 in FIG. 2 made up of metallic, organic or inorganic fiber. The fabric is formed in a general honeycomb shape. Preferably, the fabric is set in an organic or inorganic binder which is useful to maintain the honeycomb shape. The honeycomb form may be fabric/binder of organic/ceramic (i.e. inorganic), organic/organic, metallic/organic, or inorganic/organic.

The honeycomb structure 20 is then placed in reactor 9 as shown in FIG. 1. The process for deposition is described below.

Thus it is possible to obtain in a honeycomb shape:

a metallic fabric coated with ceramic, e.g., a titanium-silicon carbide coated honeycomb;

an organic fabric coated with ceramic, e.g., NOMEX coated with alumina from a sol gel; or a pyrolyzed organic fabric coated with ceramic, e.g., carbon coated with alumina.

A preferred embodiment is a pyrolyzed organic honeycomb form upon which is deposited a ceramic.

Referring to FIGS. 1–8, the loosely woven fabric 20 is shown in FIG. 2. The fabric is formed of any number of suitable reactive organic polymers which can be woven so long as the polymeric fiber generates a high char yield on initial pyrolysis and is then capable of being removed by subsequent pyrolysis or chemical degradation. Typical organic polymers include aramid, Nomex®️, Nomex/phenolic, polyacrylonitrile (PAN) or epoxy polymer. A preferred polymer fiber is polyacrylonitrile. The loosely woven organic polymer fabric woven in the desired honeycomb shaped fabric is available from, or can be woven by the Hexcel Corporation of Dublin, Calif. 94566. The organic fiber usually has an organic resin or binder to maintain the honeycomb shape until the organic fiber (and binder) is pyrolyzed. Typical organic binder resins include, for example, phenols, epoxys, silicones, polyimides, and the like. A preferred polymeric binder is a phenolic resin.

The honeycomb structure 20 is then placed in reactor 9 as shown in FIG. 1. Argon enters via value 2A, fluorometer 2B and line 2 through carburetor 1 containing ceramic precursor material and exits through line 3. Liquid precursors for the ceramic deposit in carburetor 1 include, for example trichloromethylsilane, dimethyl chlorosilane and the like. Trichloromethylsilane is preferred to produce silicon carbide (SiC). A mixture of boron trichloride, hydrogen, and silicon tetrachloride is prefererd to produce silicon boride. A mixture of ammonia and silicon tetrachloride are preferred to produce silicon nitride. A mixture of ammonia and boron trichloride is preferred to produce boron nitride.

Addition argon is controlled by valve 5, flowmeter 5A and enters line 8 via line 5B, optional gas enters line 8 controlled by valve 6 and flowmeter 6A via line 6B and hydrogen may enter line 8, via line 7B controlled by valve 7 and flowmeter 7A. These gases mix in line 8 and enter reactor 9. Reactor 9 is a conventional ceramic deposition chamber and is heated between about 700° and 1,100° C., preferably between about 800° and 1,100° C. Products are removed via line 9A pass through condensor 10 through line 11 to scrubber 12. After the gases are scrubbed they are conveyed through line 13 to filter 14 and into line 15. Vent gas is introduced via line 16A, controlled by needle valve 16 into 17. Needle valve 18 controls the flow of gas to vacuum pump 19. The gases are then vented to the atmosphere.

Figure 3:
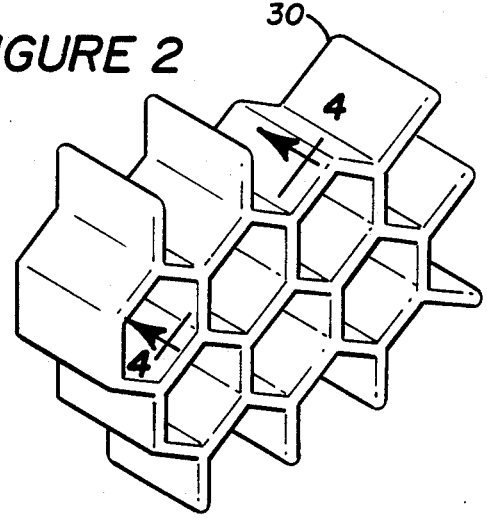
FIG. 3 is an isometric view of the honeycomb fabric after an initial deposition.

In reactor 9 the pre-ceramic material, e.g., trichloromethylsilane is thermally decomposed at between about 900° and 1,100° C. and the SiC produced is deposited fairly evenly on the loosely woven honeycomb fabric/binder as is shown by structure 30 in FIG. 3. Usually between about a 100% to 300% by weight increase is preferred for the coated honeycomb structure 30, when the substrate is to be removed. If a large deposit (greater than 300% by weight) of ceramic material is initially made before the pyrolyzed fabric 21 is removed, the subsequent removal of the pyrolyzed fabric is usually incomplete. Large deposits cause the structure to become too difficult for the oxygen to penetrate to remove the pyrolyzed fabric.

Figure 4:
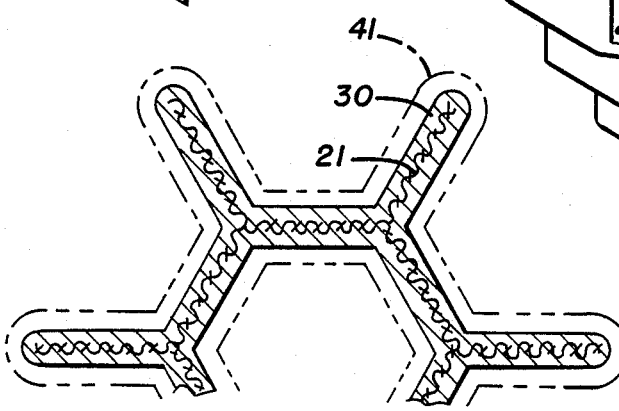
FIG. 4 is a cross section of the honeycomb structure of FIG. 3 along 4—4.

FIG. 4 is a cross-section of structure 30 along line 4—4 of FIG. 30. It shows honeycomb 21 within ceramic coating 3. The ceramic layer shown in phantom outline 41 indicates that an additional layer of ceramic optionally is deposited. This additional layer of ceramic 41 may be the same or a different ceramic than was originally deposited and found in structure 30.

Figure 5:
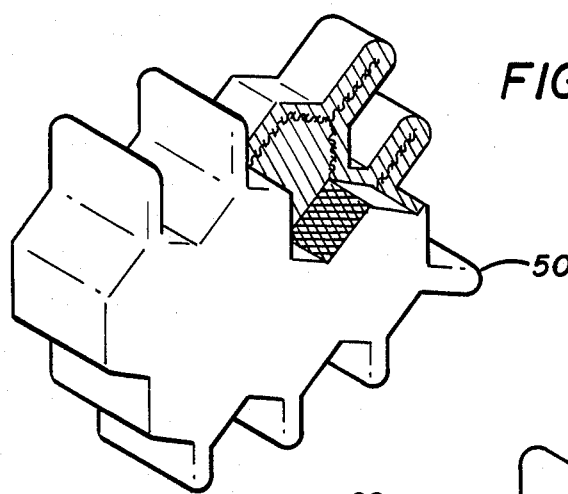
FIG. 5 is an isometric cutaway view of the honeycomb composite.

FIG. 5 shows in breakaway view the honeycomb structure of FIG. 3 in which all of the honeycomb cells are filled with ceramic deposit—a solid honeycomb 50.

Figure 6:
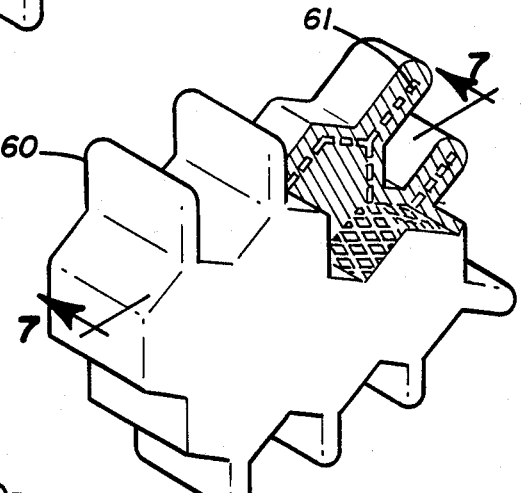
FIG. 6 is an isometric cut away view of the composite after removal of the organic honeycomb structure.

FIG. 6 shows the honeycomb structure 30 of FIG. 3 in which structure 30 is pyrolyzed at between about 700° and 1,000° C. in an restricted atmosphere having between about 2 to 5% oxygen by volume. The organic polymer fabric 20 is degraded and leaves a micro-structure (opening, voids), but retains its geometric integrity having a porous structure for subsequent deposition of ceramic. The pyrolysis must be conducted (e.g., about 1 to 5 hrs.) so that no excessive exotherm occurs in a restricted oxygen environment. If an excess of oxygen is present, the carbon material present may burn at a temperature high enough to oxidize the ceramic, e.g., SiC or $B_4C$ of the ceramic and destroy the desired honeycomb structure.

Figure 7:
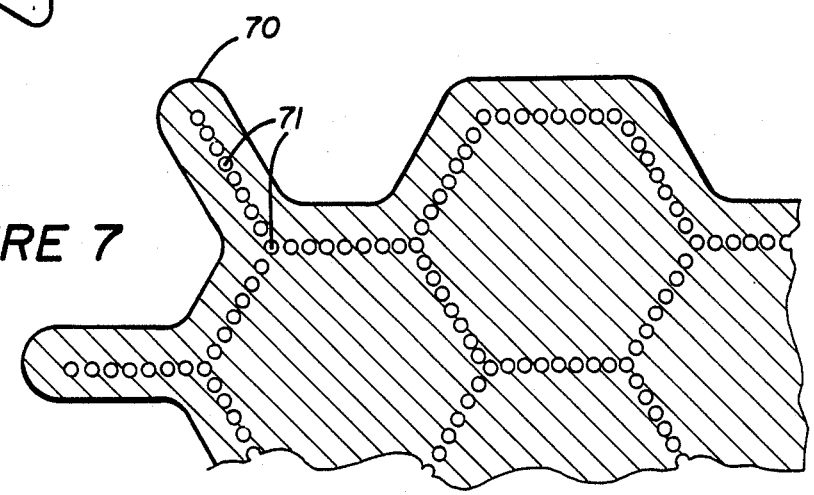
FIG. 7 is a cross section of FIG. 6 along line 7—7 showing that the organic honeycomb material has been removed.

FIG. 7 shows a cross-section 70 of structure 60 along line 7—7. Openings 71 show the voids left in the ceramic when the honeycomb fiber is removed.

Figure 8:
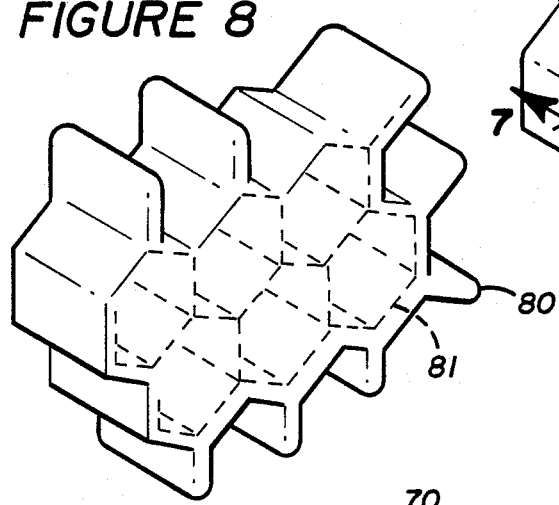
FIG. 8 is a monolithic structure where all of space the honeycomb structure has been filled by ceramic deposits.

FIG. 8 shows structure 80 as a monolithic structure wherein all of the voids left by pyrolyzing the fabric have been filled in with additional ceramic. These former voids are shown in phantom line 81. Further the honeycomb cells have been filled completely by the deposited ceramic. A ceramic structure such as 80 has enhanced physical properties such as low convective and radiative heat transfer and high interlaminar shear in comparison to a similar structure which is an open structure.

A more detailed description of the formation of a organic honeycomb/ceramic structure is given below.

A conventional chemical vapor deposition reactor is used to deposit refractory materials on substrates, such as honeycomb, see S. Motozima et al., in *Bulletin of the Chemical Science of Japan,* Vol. 48(5), pp. 1,463–1,466, published in 1975, which is incorporated herein by reference for the design of a chemical vapor deposition reactor. When the $BCl_3$, $SiCl_4$ and $H_2$ are replaced by the appropriate precursors, the corresponding ceramics, such as silicon carbide, silicon nitride, boron nitride and the like are deposited. This reactor consists of a mullite tube with a heated reaction chamber about 2.28 cm I.D. and 30.48 cm long. The reactor is heated in a resistance furnace in the temperature range of 900° to 1,300° C. and held at pressures from 50 to 760 mm mercury. Reactant gases are mixed with an inert carrier gas such as argon to obtain difficult concentrations. Various substrates in honeycomb form are suspended in the reactor tube for deposition. In the experimental procedure the substrate is heated at a programmed heating rate in an inert gas until a set temperature is obtained or suitable charred substrate is produced. At this point the reactive gas is included and continued until the desired deposition had occurred.

Honeycomb structures with the deposit are examined with X-ray to determine the composition of the deposit and also oxidized at 1000° C. to determine the concentration of refractory material.

The following Examples are intended to be illustrative, and not to be limiting in any way.

EXAMPLE 1

CVD/CVI OF SiC (a) (Organic/organic Honeycomb) The reaction system shown in FIG. 1 was used to obtain a SiC deposit from trichloromethylsilane. The substrate was honeycomb material made of carbon fiber (organic) coated with phenolic resin (organic). Honeycomb material was 2.54 cm thick and cell walls were 0.32 cm. The honeycomb material was heated to 275° C. at 50° C./min in argon flowing at 230.9 cc/min and held at this temperature for 5 min followed by continued heating to 950° C. The pressure in the system was 380 mm mercury. At this point the silane was added to the argon stream. The concentration of silane was 7.07%. The temperature was increased to 1,000° C. and the reactor held at this temperature for 321 min. Honeycomb cells were obtained with an optimum yield of SiC of 100%, and a total deposit of 298.2% based on the char yield of the honeycomb.

(b) (Inorganic/Organic) The process described in subpart (a) above is repeated except that a alumina borosilicate coated with phenolic resin is used instead of the carbon fiber coated with phenolic resin. Honeycomb cells are obtained with an optimum yield of SiC of about 100% and a total deposit of 300% based on the fiberglass in the honeycomb.

(c) (Metallic/Organic) The process described in Subpart (a) above is repeated except that a titanium fabric coated with a phenolic resin is used instead of the carbon fiber coated with a phenolic resin. Honeycomb cells are expected to be obtained with an optimum yield of SiC of about 100% and a total deposit of 300% based upon the titanium in the honeycomb.

EXAMPLE 2

CVD/CVI OF SiC (Organic/Organic Honeycomb) A similar procedure was used as described in Example 1 except that the trichloromethylsilane concentration was 9.84% and hydrogen was added to the reaction system. The hydrogen concentration was 24.6%. The total flow rate was 256.1 cc/min and the deposition time 110.5 min. An optimum yield of SiC of 100% was obtained with a total deposit of 124.6%.

EXAMPLE 3

CVD/CVI OF SiC (Inorganic/Organic Honeycomb) A similar procedure was used in Example 1 except 6.85% silane was used as the reactant gas and a NEXTEL (alumina boroscilicate)/phenolic substrate was used. The deposit time was 79.3 min. An optimum yield of SiC of 100% was obtained and 83.6% total deposit.

EXAMPLE 4

CVD/CVI OF SiC, $B_4Si$ or BN (a) (Organic/Organic Honeycomb) A similar procedure as in Example 3 was used except the concentration of silane was 6.85% and the honeycomb was Nomex-/Epoxy 832 with about 0.15 cm wide cell walls. The deposition time was 112.1 min. Instead of 275° C., the intermediate temperature in the program was 500° C. The maximum reactor temperature remained 1,100° C. The optimum SiC yield was 100% and the total deposit was 238.7%.

(b) $B_4Si$—The procedure of Example 4 (a) was repeated using an equivalent amount of $BCl_3$, $SiCl_4$ and $H_2$ instead of silane. The corresponding $B_4Si$ ceramic is expected to be deposited on the honeycomb substrate.

(c) BN—The procedure of Example 4(a) is repeated using an equivalent amount of $BCl_3$ and ammonia instead of silane. The corresponding BN ceramic is expected to be deposited on the honeycomb substrate.

EXAMPLE 5

CVD/CVI OF SiC (Organic/Organic Honeycomb) A similar procedure was used in Example 1 except the concentration of silane was 6.04% and the pressure 760 mm of mercury. The deposition time was 111.9 min. The optimum yield of SiC was 89.8% and the total deposit 95.3%.

EXAMPLE 6

CVD/CVI OF SiC (Organic/Organic Honeycomb) A similar procedure was used as in Example 1 except the silane used was dichlorodimethylsilane. The concentration of silane was 7.07% and the pressure 760 mm mercury. The deposition time was 107.3 min. The optimum yield of SiC was 97.8% and the total deposition 73.1%.

EXAMPLE 7

CVD/CVI OF $B_4Si$ (Inorganic/Inorganic Honeycomb) A similar procedure as is found in Example 2 above is used, however the honeycomb used in a NOMEX having a SiC binder. The Organic is oxidized in 4% oxygen at 700° C. leaving a SiC structure having honeycomb shaped openings and holes in the honeycomb where the organic had been. Subsequently a $B_4Si$ layer is deposited on the honeycomb structure as is described in Example 4(b).

EXAMPLE 8

REMOVAL OF PYROLYZED ORGANIC HONEYCOMB

The honeycomb structure produced in Example 1(a) above is placed in a chamber at about 900° C. in a 4% oxygen atmosphere for 2 hr. The SiC honeycomb structure does not have any residue of organic honeycomb.

EXAMPLE 9

DEPOSITION OF CERAMIC INTO THE VOIDS

The honeycomb structure produced in Example 7 above is placed in the deposition/infiltration chamber as described in Example 1(a) above. SiC is deposited in the holes (or openings) left by pyrolyzing the organic material present, using the conditions described in Example 1(a) above. SiC is deposited in the voids using the conditions described in Example 1(a). A solid SiC honeycomb is obtained.

While some embodiments of the invention have been shown and described herein, it will become apparent to those skilled in the art that various modifications and changes can be made in the method to produce improved ceramic structures by CVD/CVI of metallic, ceramic or organic honeycomb structures and the structures obtained thereby without departing from the spirit and scope of the present invention. All such modifications and changes coming within the scope of the appended claims are intended to be covered thereby.

We claim:

1. A method for the production of a three dimensional ceramic honeycomb structure, which method comprises:
    (a) obtaining and placing it in the reactor of a chemical vapor deposition-chemical vapor infiltration reaction system, a loosely woven fabric/binder wherein the woven fabric consists essentially of metallic, ceramic or organic fiber and the binder consists essentially of an organic or inorganic material wherein the fabric/binder has and retains a three-dimensional honeycomb shape, with the proviso that when the fabric is metallic or ceramic, the binder is only an organic material;
    (b) substantially evenly depositing at least one layer of ceramic on and within the three-dimensional fabric/binder of step (a) by chemical vapor deposition and chemical vapor infiltration; and
    (c) removing the three-dimensional ceramic coated honeycomb structure from the reaction system.

2. The method of claim 1 wherein in step (a) the fabric is metallic and the binder is organic.

3. The method of claim 2 wherein the fabric is titanium and the binder is phenolic resin.

4. The method of claim 1 wherein in step (a) the fabric is ceramic and the binder is organic.

5. The method of claim 4 wherein the fabric is fiberglass and the binder is phenolic resin.

6. The ceramic honeycomb structure produced by the method of claim 1.

7. The ceramic honeycomb structure produced by the method of claim 2.

8. The ceramic honeycomb structure produced by the method of claim 4.

9. A method for the production of a three-dimensional lightweight ceramic composite honeycomb structure, which method comprises:
   (a) pyrolyzing a loosely woven fabric/binder having a three-dimensional honeycomb shape and having a high char yield and three-dimensional geometric integrity during and after pyrolysis at between about 700° and 1,100° C.;
   (b) substantially evenly depositing at least one layer of ceramic material on and within the three-dimensional pyrolyzed fabric/binder of step (a) by chemical vapor deposition and chemical vapor infiltration in a reaction system; and
   (c) removing the pyrolyzed fabric/binder of the structure of step (b) by slow pyrolysis at between about 700° and 1000° C. in between about a 2 to 5% by volume oxygen atmosphere for between about 0.5 and 5 hr;
   (d) substantially evenly depositing on and within the rigid hollow honeycomb structure of step (c) at least one additional layer of the same or a different ceramic material by chemical vapor deposition and chemical vapor infiltration; and
   (e) removing the ceramic article from the chemical vapor deposition-chemical vapor infiltration reaction system.

10. The method of claim 9 wherein in step (a) the fabric is an organic polymer.

11. The method of claim 10 wherein in step (b) the ceramic material is selected from the group consisting of silicon carbide, silicon boride, boron nitride, boron carbide, hafnium carbide and hafnium nitride.

12. The method of claim 11 wherein the organic polymer is selected from the group consisting of polyamide, phenolic, polyamide, polystyrylpyridine, and epoxy polymer.

13. The method of claim 11 wherein the ceramic material is selected from the group consisting of silicon carbide and silicon boride.

14. The method of claim 12 wherein the organic polymer is polyamide.

15. The method of claim 13 wherein the organic polymer is polyamide.

16. The ceramic composite honeycomb structure having increased structural stability, improved physical properties, lighter weight properties and improved temperature limits produced by the method of claim 10.

17. The ceramic composite honeycomb structure having increased structural stability, improved physical properties, lighter weight properties and improved temperature limits produced by the method of claim 11.

18. The ceramic composite honeycomb structure having increased structural stability, improved physical properties, lighter weight properties and improved temperature limits produced by the method of claim 12.

19. The ceramic composite honeycomb structure having increased structural stability, improved physical properties, lighter weight properties and improved temperature limits produced by the method of claim 13.

20. The ceramic composite honeycomb structure having increased structural stability, improved physical properties, lighter weight properties and improved temperature limits produced by the method of claim 14.

21. The ceramic composite honeycomb structure having increased structural stability, improved physical properties, lighter weight properties and improved temperature limits produced by the method of claim 15.

22. A ceramic three-dimensional honeycomb-shaped composite article having increased structural stability, improved physical properties, lighter weight properties and improved temperature limits having at least one surface layer comprising a vapor-deposited first ceramic material and at least one inner layer of a second vapor-deposited ceramic material wherein the second ceramic material is the same or different from the deposited first ceramic material and the first and second ceramic material are each deposited by chemical vapor deposition and chemical vapor infiltration.

23. A ceramic three-dimensional solid composite article having increased structural stability, improved physical properties, lighter weight properties and improved temperature limits having at least one surface layer comprising a vapor-deposited first ceramic material and at least one inner layer of a second vapor-deposited ceramic material wherein the second ceramic material is the same or different from the deposited first ceramic material and wherein the solid composite is formed from an integral three-dimensional honeycomb structure and the first and second ceramic material are each deposited by chemical vapor deposition and chemical vapor infiltration.

24. The ceramic solid composite of claim 23 wherein the first and second ceramic materials are silicon carbide.

* * * * *

UNITED STATES PATENT AND TRADEMARK OFFICE
CERTIFICATE OF CORRECTION

PATENT NO. : 4,824,711

DATED : 4/25/89

INVENTOR(S) : Domenick Cagliostro, et. al.

It is certified that error appears in the above-identified patent and that said Letters Patent is hereby corrected as shown below:

In column 4, line 6, change "binde" to --binder--.

In column 5, line 2, change "prefered" to --preferred--.

Signed and Sealed this

Second Day of July, 1991

*Attest:*

HARRY F. MANBECK, JR.

*Attesting Officer*   *Commissioner of Patents and Trademarks*